April 29, 1969 R. W. CONRAD ET AL 3,441,453

METHOD FOR MAKING GRADED COMPOSITION MIXED COMPOUND SEMICONDUCTOR MATERIALS

Filed Dec. 21, 1966

INVENTORS
Raymond W. Conrad
Ronald H. Cox

BY Jack A Kanz

ATTORNEY 3,441,453
Patented Apr. 29, 1969

3,441,453

METHOD FOR MAKING GRADED COMPOSITION MIXED COMPOUND SEMICONDUCTOR MATERIALS

Raymond W. Conrad and Ronald H. Cox, Dallas, Tex., assignors to Texas Instruments Incorporated, Dallas, Tex., a corporation of Delaware Filed Dec. 21, 1966, Ser. No. 603,626
Int. Cl. H01l 7/62, 7/36
U.S. Cl. 148—175 4 Claims This invention relates to a method of producing compound semiconductor materials, and particularly to the vapor phase growth of graded composition Group III–A—V–A compound semiconductor materials.

Figure 1A:
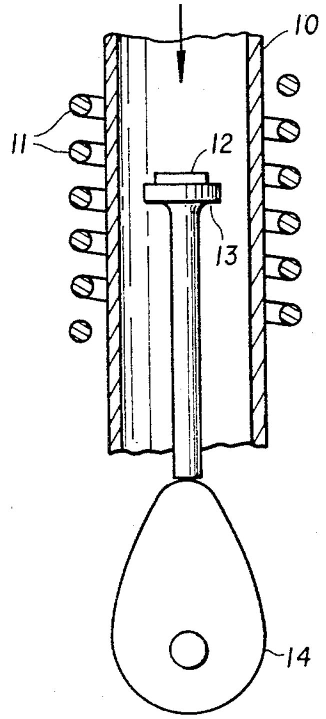

Semiconductor materials have become increasingly important in the field of electronics because of their usefulness in fabricating extremely minute circuits. Certain properties of semiconductor materials also permit the construction of unique devices which are not possible of construction with conventional vacuum tube technology.

In the prior art, the usual semiconductor materials for fabricating devices are crystals of certain elements contained in Group IV–A of the Periodic Table of Elements, specifically, germanium and silicon. Experience has shown, however, that silicon devices are somewhat limited in frequency response but allow operation at temperatures up to 200° C., whereas germanium devices have relatively good frequency response but cannot operate above about 85° C.

In the search for other semiconductor materials, investigators discovered that some binary and ternary compounds exhibited semiconductor properties. Some of these compound semiconductors, particularly those which contain one element from Group III–A and one element from Group V–A of the Periodic Table, have been disclosed in U.S. Patent 2,798,989, dated May 31, 1960, and issued to H. Welker, said patent relating to Group III–A—V–A compounds exhibiting semiconductor properties.

Furthermore, various characteristics of a semiconductor material, such as energy gap, lifetime of minority carriers, and electron mobility, greatly effect the utility of a device made from such material. Because of this fact, it would be desirable if various properties of certain semiconductor materials could be combined. For example, it would be desirable in solar cells to have various layers of semiconductor material with different energy gaps.

Recent advances in the semiconductor art, particularly in the areas of compound semiconductor lasers and compound semiconductor integrated circuits, have stimulated workers to develop methods of producing mixed composition compound semiconductor materials. By a mixed composition is meant a pseudo-binary compound in which more than one element from a particular group in the Periodic Table are compounded with one or more elements from another group in the Periodic Table while maintaining stoichiometry with respect to periodic group. For example, a mixed composition compound semiconductor compounded from Groups III–A and V–A may be represented by the general formula $$A_aB_bC_cD_dE_eF_f$$

where:

A, B, and C represent elements from Group III–A;
D, E, and F represent elements from Group V–A;
$a+b+c=1$, and
$d+e+f=1$, where each lower case subscript represents the number of atoms of the immediately preceding element present in a single molecule of the material represented by the general formula.

A typical example of such mixed composition compound semiconductor material is the Group III–A—V–A compound $GaAs_xP_{(1-x)}$. It will be understood that the expression $GaAs_xP_{(1-x)}$ is used herein to describe the pseudo-binary compound wherein gallium (Ga) is combined with arsenic (As) and phosphorus (P), the number of atoms of Ga being equal to the number of atoms of As and P combined. Thus since Group III–A elements combine with Group V–A elements in a ratio of 1:1, the subscript $x$ in the above expression is used to denote the fractional number of atoms of As which is present in a single molecule of $GaAs_xP_{(1-x)}$. Among the advantages of this material is that it has an energy gap between that of gallium arsenide (GaAs) and gallium phosphide (GaP). By the proper selection of the value of $x$ in the above formula, a semiconductor material may be produced having any desired energy gap between the values of 1.38 ev. and 2.24 ev., which are the energy gap values for GaAs and GaP, respectively. Furthermore, by varying the value of $x$ as the semiconductor material is formed, a body of semiconductor material may be produced in which the bandgap is graded from 1.38 ev. to 2.24 ev. The resulting material is referred to as graded bandgap material.

A particular advantage of such graded bandgap materials is the field produced when used as the base region of a transistor. For example, when the base is graded from a high bandgap at the emitter junction to a lower bandgap at the collector junction, injected carriers are accelerated by a force proportional to the rate of change of bandgap with distance. Accordingly, steeply graded thin base layers are most desirable.

Graded bandgap semiconductor material in the pseudo-binary form described above is conventionally formed by the simultaneous vapor phase reaction of a plurality of Group V–A halides with a Group III–A element in a decreasing temperature gradient. By varying the relative proportions of the Group V–A halides the value of $x$ in the resultant material is varied, thus providing a graded bandgap material. However, variation of the composition of the resultant material requires critical control of flow rates, temperatures, vapor pressures, and flow rate changes, thus making this method of forming graded bandgap material extremely difficult.

The present invention advantageously provides a method of producing mixed composition compound semiconductor materials in which the composition of the ternary product may be varied as desired to form monocrystalline semiconductor material in which the composition varies with thickness of the material.

An object of the invention is to provide a method of producing mixed composition compound semiconductor material in a simple operation, avoiding the necessity of varying the temperatures and flow rates of the reactant gases. Another object is to provide a method of uniformly varying the composition of pseudo-binary Group III–A—V–A compounds over a very narrow thickness of material. A further object is to provide thin epitaxial deposits of graded bandgap semiconductor material.

Figures 1B, 2:
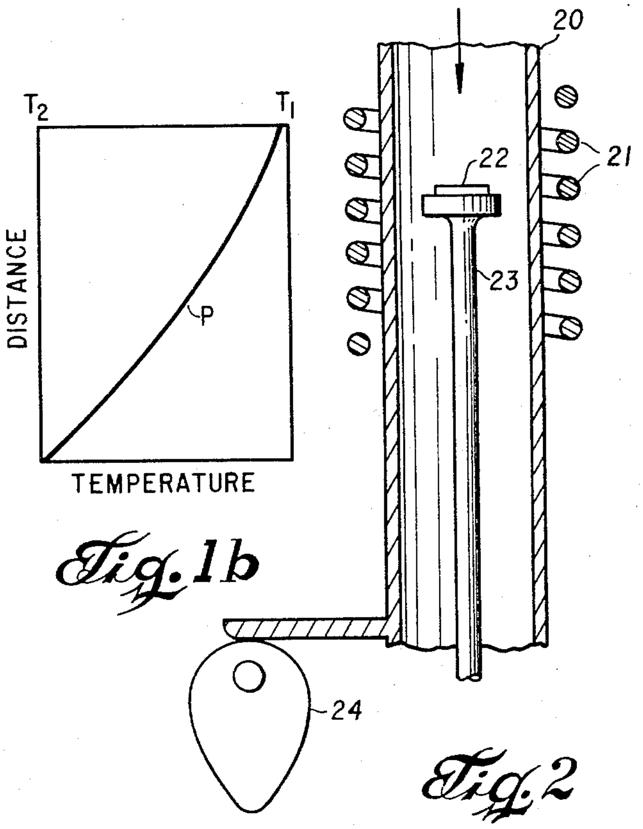
Figure 3:
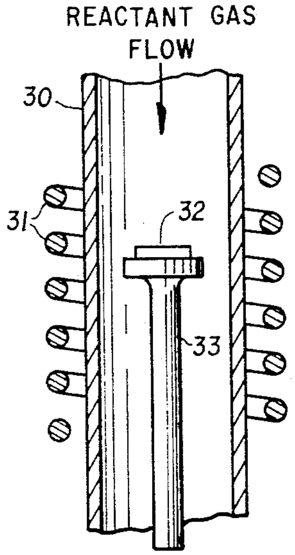
Figure 4:
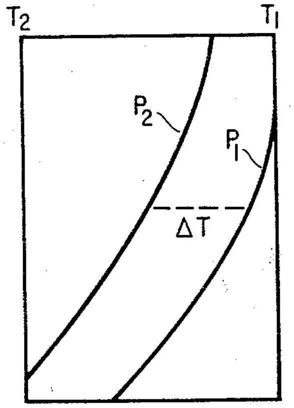

Other objects and advantages of the invention will become more readily understood from the following detailed description when taken in conjunction with the appended claims and attached drawing in which:

FIGURE 1*a* is a sectional view of a vapor phase reactor having a movable substrate holder, FIGURE 1*b* is a graphical illustration of the temperature gradient maintained in the reactor chambers shown in FIGURES 1*a* and 2, FIGURE 2 is a sectional view of a movable vapor phase reactor having a fixed sample holder, FIGURE 3 is a sectional view of a vapor phase reactor having a fixed substrate holder, and FIGURE 4 is a graphical illustration of temperature gradients maintained in the reactor of FIGURE 3 under various conditions.

In accordance with the invention, Group V–A halides are reacted with Group III–A elements in a decreasing temperature gradient reactor. The reaction products of the vapor phase reaction are deposited on a suitable substrate in the cooler region of the reactor. The composition of the epitaxial deposit is varied during the deposition reaction by varying the temperature of the substrate. Under constant flow conditions of reactants into the furnace, the composition of the resultant epitaxial deposit is a function of the temperature of the substrate. Consequently by varying the location of the substrate with respect to the temperature gradient the composition of the resultant epitaxial material is gradually varied producing a graded composition semiconductor material. The gradation of the semiconductor composition can be varied in either direction, thus providing accurate control over the composition of the epitaxial deposit and providing a method for varying the bandgap of the resultant material as desired.

One method of practicing the invention is shown in FIGURE 1*a*. In FIGURE 1*a* the deposition chamber of a suitable reactor is shown comprising a cylindrical chamber 10 suitably positioned within a furnace. By appropriately controlling the current passing through the heating coils 11, a temperature gradient is established across the reaction chamber. The temperature decreases in the direction of gas flow through the furnace as graphically illustrated in FIGURE 1*b*.

A suitable substrate 12 is posititoned on a substrate holder 13 slideably mounted within the deposition chamber 10. Rotation of a cam 14 actuates the substrate holder 13 to change the position of the substrate relative to the chamber 10. As the substrate is moved in the chamber, the temperature of the surface of the substrate changes as indicated in FIGURE 1*b*. Reactant gases are injected into the decreasing temperature gradient and pass down through the reaction furnace normal to the surface of the substrate 12.

It has been discovered that the composition of a pseudobinary Group III–A—V–A compound formed by the vapor phase reaction of Group V halides with Group III elements is highly dependent upon the temperature of the substrate. Accordingly, by varying the position of the substrate with respect to the furnace, thus altering the temperature of the substrate in the decreasing temperature gradient of the furnace, the composition of the resultant epitaxial layer is varied. As shown in FIGURE 1, the location of the substrate with respect to the temperature gradient can be manually varied as by a suitable movable substrate holder 13 and cam 14. Alternatively, the substrate holder may be permanently fixed and the position of the reaction furnace varied with respect to the substrate as shown in FIGURE 2. In FIGURE 2 the substrate holder 23 is permanently fixed. The deposition chamber 20 and heating coils 21 are slideably mounted so that rotation of cam 24 moves the deposition chamber 20 and heating coils 21 with respect to the substrate 22, thereby changing the temperature of the substrate.

The temperature gradient of the deposition zone of the reactor is graphically illustrated in FIGURE 1*a*. By varying the position of the substrate with respect to the furnace, or vice versa, the temperature of the substrate varies along the temperature gradient curve P shown in FIGURE 1*a*.

Another method of practicing the invention is shown in FIGURE 3. In FIGURE 3 the deposition zone of an epitaxial reaction is shown comprising a cylindrical chamber 30 surrounded by heating coils 31. A substrate 32 is positioned within the reactor on a suitable support 33. Both the reactor and the substrate holder are permanently mounted in a fixed relation. In operation the reactant gases flow through the chamber 10 normal to the surface of the substrate 32. By control of the current passing through heating coils 31 a temperature gradient is established across the length of the chamber 10, the temperature decreasing in the direction of gas flow.

The temperature gradient or thermal profile of the deposition reactor is graphically illustrated in FIGURE 4.

The curve $P_1$ graphically illustrates the temperature profile of the deposition chamber 30 under one set of conditions. As shown in the figure, the temperature of the chamber is graded from a high near the upper end to a low near the lower end, the temperature profile traversing the line $P_1$. In practicing the invention, the temperature of the chamber is uniformly reduced maintaining the temperature gradient. Thus under a second set of conditions the temperature gradient of the furnace is maintained, the thermal profile being illustrated by curve $P_2$.

The change in temperature in any part of the chamber is the difference between the two curves $P_1$ and $P_2$, as shown in the figure as $\Delta T$. Thus the temperature of the substrate can be gradually lowered or raised as desired to effect a graded bandgap deposit by changing the conditions of the heating coils during the deposition reaction.

Various compositions of $In_yGa_{(1-y)}As$ have been prepared by passing a reactant gas of constant composition containing As, $H_2$, gallium chloride, and indium chloride over substrates at various temperatures. The reactant gas stream was prepared by passing gaseous streams of $H_2$-$AsCl_3$ over heated containers of indium and gallium. The composition of the deposit varied with temperature according to the following table:

| Temp. of Substrate, ° C. | Wt. Percent As | Wt. Percent In | Wt. Percent Ga | Composition (Ga:In:As) |
|---|---|---|---|---|
| 657 | 51.4 | 7.95 | 40.65 | .85:.10:1.00 |
| 620 | 46.5 | 17.0 | 36.5 | .84:.24:1.00 |
| 590 | 37.3 | 37.3 | 25.0 | .71:.65:1.00 |
| 550 | 37.0 | 55.0 | 8.0 | .23:.97:1.00 |

Any of several known methods of preparing the required reactant gas stream may be used. A suitable method is shown by Finch and Mehal, "Preparation of $GaAs_xP_{1-x}$ by Vapor Phase Reaction," J. Electrochemical Society, vol. III, No. 7, July 1964.

Although the invention has been specifically described in terms of varying the composition of (In, Ga)As, these examples are to be taken as illustrative of the principles thereof. Graded compositions of other mixed composition semiconductor compounds from the general formula $A_aB_bC_cD_dE_eF_f$ as defined above may be formed from suitably prepared reactant gas streams by varying the temperature of the substrate in accordance with the teachings of this invention. It will be understood that certain modifications and substitutions will become apparent to those skilled in the art without departing from the spirit and scope of the invention as defined by the appended claims.

What is claimed is:

1. The method of making a graded composition Group III–A—V–A compound semiconductor deposit on a substrate, said deposit having the general formula $$Al_aGa_bIn_cP_dAs_eSb_f$$

wherein the values of *a*, *b*, *c*, *d*, *e* and *f* range from zero to one varying with thickness and $a+b+c=1$ and $c+d+e=1$, comprising the steps of (a) introducing a gaseous mixture containing elements from Groups III–A and V–A of the Periodic Table into a reactor under constant flow conditions such that said mixture is of constant composition, (b) establishing a temperature gradient across said reactor, the temperature decreasing with distance in the direction of gas flow in said reactor, (c) placing a substrate within said reactor, (d) moving said substrate with respect to said reactor, thereby gradually changing the temperature of said substrate so as to deposit said graded composition compound semiconductor.

2. The method of claim 1 wherein said temperature of said substrate is varied between about 657° C. and about 550° C.

3. The method as defined in claim 1 wherein $$In_xGa_{1-x}As$$

epitaxially deposits on said substrate in which the value of $x$ varies with thickness of said deposit.

4. The method of making a graded composition Group III–A—V–A compound semiconductor deposit on a substrate, said deposit having the general formula $$Al_aGa_bIn_cP_dAs_eSb_f$$

wherein the values of $a$, $b$, $c$, $d$, $e$, and $f$ range from zero to one varying with thickness and $a+b+c=1$ and $f+d+e=1$ comprising the steps of (a) introducing a gaseous mixture containing elements from Groups III–A and V–A of the Periodic Table into a reactor under constant flow conditions such that said mixture is of constant composition, (b) placing a substrate within said reactor, (c) gradually changing the temperature of said substrate so as to deposit said graded composition compound semiconductor.

References Cited

UNITED STATES PATENTS

| | | | |
|---|---|---|---|
| 3,218,203 | 11/1965 | Ruehrwein | 148—175 |
| 3,224,913 | 12/1965 | Ruehrwein | 117—106 XR |
| 3,261,726 | 7/1966 | Ruehrwein | 148—175 XR |
| 3,341,376 | 9/1967 | Spenke et al. | 148—175 |

L. DEWAYNE RUTLEDGE, *Primary Examiner.*

P. WEINSTEIN, *Assistant Examiner.*

U.S. Cl. X.R.

252—62.3; 117—107.2, 201, 106; 23—204; 148—174